(12) United States Patent
Bogner et al.

(10) Patent No.: US 9,632,111 B2
(45) Date of Patent: Apr. 25, 2017

(54) PASSIVE INPUT FILTER WITH CLAMPING FOR SHUNT MEASUREMENTS

(71) Applicant: Infineon Technologies AG, Neubiberg (DE)

(72) Inventors: Peter Bogner, Wernberg (AT); Jens Barrenscheen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 234 days.

(21) Appl. No.: 14/102,185

(22) Filed: Dec. 10, 2013

(65) Prior Publication Data

US 2015/0160266 A1    Jun. 11, 2015

(51) Int. Cl.

| | | |
|---|---|---|
| G01K 7/01 | (2006.01) | |
| H03M 1/12 | (2006.01) | |
| G01R 1/20 | (2006.01) | |
| H03H 7/01 | (2006.01) | |
| H03H 7/06 | (2006.01) | |
| G01R 19/25 | (2006.01) | |

(52) U.S. Cl.
CPC ......... *G01R 1/203* (2013.01); *G01R 19/2503* (2013.01); *H03H 7/0138* (2013.01); *H03H 7/06* (2013.01)

(58) Field of Classification Search
CPC  G01R 19/0092; G01R 1/203; G01R 19/2503; G01R 31/2601; G01R 31/3004; G01R 31/31905; H03H 7/0138; H03H 7/06; G05F 1/56

USPC ........... 324/126, 311, 327, 354, 402, 765.01, 324/177, 139, 143, 772; 323/273–285
See application file for complete search history.

(56) References Cited

U.S. PATENT DOCUMENTS

| | | | | |
|---|---|---|---|---|
| 4,270,082 A | * | 5/1981 | Zaveri ....................... | G05F 1/13 323/248 |
| 5,933,573 A | * | 8/1999 | Lukenich ................ | H02P 6/085 318/369 |
| 2004/0027190 A1 | * | 2/2004 | Sher ........................ | G11C 5/145 327/530 |
| 2004/0056701 A1 | * | 3/2004 | Smith ....................... | H04N 5/18 327/333 |
| 2008/0259997 A1 | * | 10/2008 | Gardner ................... | G01K 7/01 374/170 |

FOREIGN PATENT DOCUMENTS

| | | |
|---|---|---|
| CN | 1043059 A | 6/1990 |
| CN | 2699312 Y | 5/2005 |
| CN | 1708102 A | 12/2005 |
| CN | 2798443 Y | 7/2006 |

(Continued)

Primary Examiner — Patrick Assouad
Assistant Examiner — Taqi Nasir
(74) Attorney, Agent, or Firm — Slater Matsil, LLP (57) ABSTRACT

A method and an apparatus for a shunt measurement are provided. In one embodiment a measurement unit includes an input for a source device, the source device configured to provide a first analog voltage level to be measured in a first operating mode of the source device and a second analog voltage level to be measured in a second operating mode of the source device, a control input configured to detect the operating mode of the source device and an input stage configured to minimize a reaction time of the measurement unit after a change of the operating mode of the source device.

19 Claims, 6 Drawing Sheets

(56) References Cited

FOREIGN PATENT DOCUMENTS

| CN | 102651624 A | 8/2012 |
| CN | 202794334 U | 3/2013 |
| CN | 202885880 U | 4/2013 |

* cited by examiner

Figure 1: Typical waveform of a shunt voltage

PASSIVE INPUT FILTER WITH CLAMPING FOR SHUNT MEASUREMENTS

TECHNICAL FIELD

The invention relates to systems and methods for shunt measurement units and digital interfaces to a control device, such as a microcontroller. More specifically, the invention relates to methods and systems for a passive input filter with adjustable clamping for shunt measurements.

BACKGROUND

In some applications, such as in the control of electric AC motors, more than one analog input voltage has to be measured and converted into a digital value by an analog-to-digital converter (ADC). In the case where only one ADC is available, different analog input values have to be connected to the input of the ADC one after the other. In AC motor control applications, this is a common scenario where the phase currents are measured via independent shunt resistors.

In other applications, it is also possible that one analog input value is used as input to the ADC, but the operating mode (e.g., different signal conditioning settings, such as input amplification) of that analog input value is changed at specific points in time. In AC motor control applications, this is also a common scenario where the phase currents are measured via a shared shunt resistor. Furthermore, the switching of the power switches in an AC motor may also introduce noise, and different switching patterns of the power switches define different currents to be monitored via the common shunt resistor. For example, with a first switching pattern (first operating mode), the phase current of a first phase can be measured via the common shunt, and with a second switching pattern (second operating mode), the phase current of the second phase can also be measured via the common shunt.

In such cases, the voltage at the analog input can change significantly between different operating modes (here, the definition of operating mode may also comprise the change of the input signal as well as change of signal conditioning parameters). Especially in applications where more than one voltage is measured at a common shunt resistor, the input voltages may change significantly.

In some applications the input voltage can be directly used as input for an ADC, whereas in other applications there is a need for additional amplification or fast level checks by comparator units. These functions may be handled by an input stage associated with the ADC.

Figure 1:
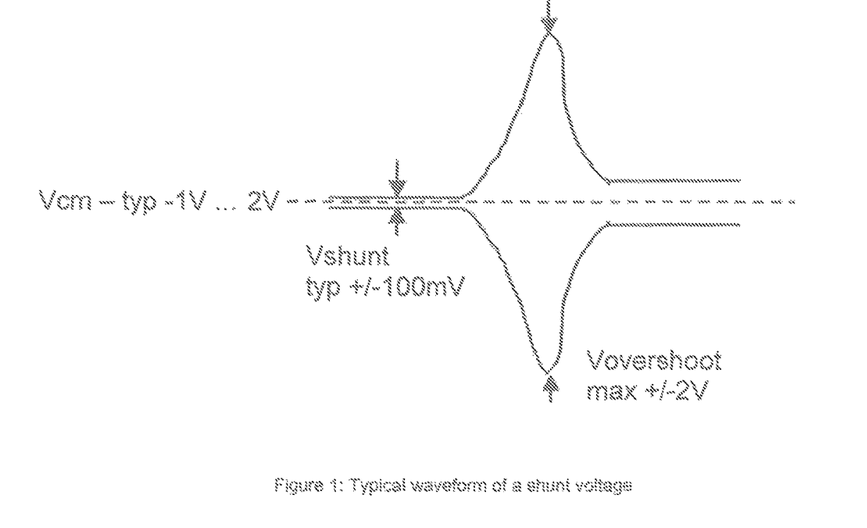
FIG. 1 shows the waveform of a typical shunt voltage to be measured.

FIG. 1 shows a typical voltage to be measured. The voltage is in the range of a few hundred mV and is converted to a digital value. At the switching time point (e.g., the change of operating mode of the input signal), overshoots can occur in the range of a few volts. Furthermore, the voltage to be measured, (i.e., common mode voltage) may also vary by a few volts between the different operating modes.

The reaction time to changes in the input signal of the input stage (i.e., the time between the change of an operating mode and the point where, e.g., an ADC can deliver a correct result or a comparator output is valid) should be minimized to allow fast reaction of higher level control loops or to avoid a "blind window" when checking the input voltage against thresholds, e.g., for overcurrent events. The reaction depends on the noise and unintended overshoots when changing the operating mode of the input signal. The reaction time of the system plays an important role in the system architecture and thus should be minimized.

Furthermore, the implementation of a measurement unit (i.e., the input of the ADC or signal conditioning unit such as the input amplifier shown below in FIG. 2) should be feasible in a standard technology without special high speed or high voltage devices. The measurement should also have an anti-aliasing filter with overload limitation (i.e., clamping properties).

Figure 2:
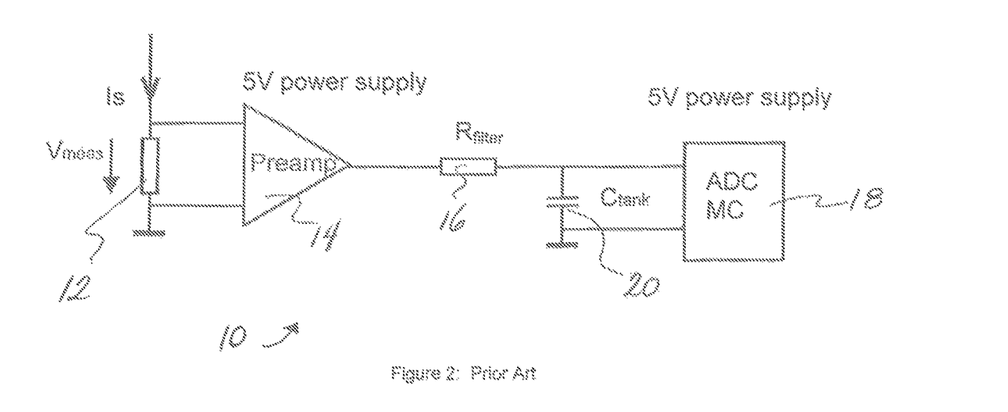
FIG. 2 shows a schematic diagram of a conventional circuit for shunt measurements.

FIG. 2 is a high-level block diagram illustrating a conventional circuit 10 for a standard shunt measurement with high current shunts. The conventional shunt circuit 10 enables the measurement of a chip external shunt voltage. The conventional shunt circuit 10 may include a shunt resistor 12 through which a shunt current runs, a preamplifier 14 coupled to the shunt resistor 12, and a passive RC filter, 16, 20. An Analog-to-Digital Converter (ADC) 18, that can be located on a microcontroller or other control device, is coupled to the conventional shunt circuit 10.

The shunt current, Is, may be in the range of a few Amperes to 100 Amperes and may generate a voltage Vmeas of a few hundred mV. This voltage may be fed to the preamplifier 14 which generates an output voltage with a full scale range of typically 3V to 5V. This voltage is then filtered by the passive first order anti-aliasing filter 16, 20 and converted by a conventional Analog-to-Digital Converter (ADC) 18 to a digital value. The amplifier of the conventional shunt circuit 10 also has a clamping property which limits the output voltage to a maximum of 3V to 5V (depending on the maximum input voltage of the ADC), thus avoiding a strong overload of the anti-aliasing filter at high overshoots appearing at the shunt. A strong overload causes a long recovery time which is not acceptable for certain applications.

Conventional shunt circuits such as that shown in FIG. 2 have several disadvantages. The conventional shunt circuit 10 of FIG. 2 requires a very fast and accurate preamplifier, external components and an input channel for the ADC. The preamplifier of the conventional shunt circuit 10 is difficult to implement into a standard control device (e.g., a microcontroller) and requires a lot of area and current, thus significantly increasing the costs associated with the control device. Another stringent requirement of the preamplifier is a huge common mode input voltage range varying in the range of a few volts (here, "huge" means that the required common mode range is much bigger than the input signal range of the measurement voltage due to current flowing through the shunt resistor). That means that the common mode input voltage can be a factor of 10 higher than the measurement voltage. Additionally, the implementation in FIG. 2 shows two different integrated circuits for the preamplifier and the ADC which consumes a significant amount of area and power. Finally, conventional ADCs for shunt measurements are often located directly on the control device (e.g., a microcontroller) whereas the shunt resistor is normally located close to the power switches. As a consequence, the analog input signal "sees" a long way from the shunt to the input of the control device with all known drawbacks, such as induced noise.

Therefore, there exists a need for a system and a method for shunt measurements which overcomes these disadvantages. More specifically, there is a need for a method and system for a passive input filter with adjustable clamping for shunt measurements that require less area and less power yet increases accuracy, speed and efficiency.

SUMMARY OF THE INVENTION

In accordance with an embodiment of the invention, a system for performing a shunt measurement comprises an input for a source device providing a first analog voltage level to be measured in a first operating mode of the source device and a second analog voltage level to be measured in a second operating mode of the source device, a control input to detect the operating mode of the source device, and an input stage configured to minimize the reaction time of the measurement unit after a change in operating mode of the source device.

In accordance with an embodiment of the invention, the system further comprises means for changing at least partly the parameters of the input stage according to the operating mode of the source device. In another embodiment, the input stage of the system further comprises a clamping structure for the input voltage that can be configured according to the operating mode of the source device. The input stage of the system may further comprise a filter structure for the input voltage that can be configured according to the operating mode of the source device.

In yet another embodiment, the parameters of the input structure are configured for the different operating modes of the source device and may be dynamically changed.

Additionally, the input may be configured so that it can be connected to at least one control signal for a power switch where the logic state of the power switch control signal defines at least a part of the parameters of the input stage. Alternatively, the system may also comprise an analog-to-digital converter (ADC) where the ADC is configured to convert at least one analog voltage level delivered by the source device and the parameters of the input stage may be changed at least partly based on a previous conversion result of the ADC.

In accordance with another embodiment of the invention, a method for configuring the parameters of an input stage of a shunt measurement unit comprises the steps of receiving a control signal defining the operating mode of a source device and configuring at least a part of the parameters of the input structure according to the control signal. In one embodiment, the method further comprises the step of configuring at least a part of the parameters of the input stage according to a previous conversion result of the analog-to-digital converter. In another embodiment, the method further comprises the step of measuring the input signal of the measurement unit via an analog-to-digital converter.

Further features, aspects and advantages of embodiments of the invention will become apparent from the following detailed description of the embodiments of the invention made with reference to the accompanying drawings.

BRIEF DESCRIPTION OF THE DRAWINGS

The accompanying drawings are included to provide a further understanding of embodiments of the invention and are incorporated in and constitute a part of this specification. The drawings illustrate embodiments of the invention and together with the description serve to explain the principles. Other embodiments of the invention and many of the intended advantages of the embodiments of the invention will be readily appreciated as they become better understood by reference to the following detailed description.

DETAILED DESCRIPTION OF ILLUSTRATIVE EMBODIMENTS

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the invention. Therefore, the following detailed description is not to be taken in a limiting sense, and the scope of the embodiments of the invention is defined by the appended claims.

Figure 3:
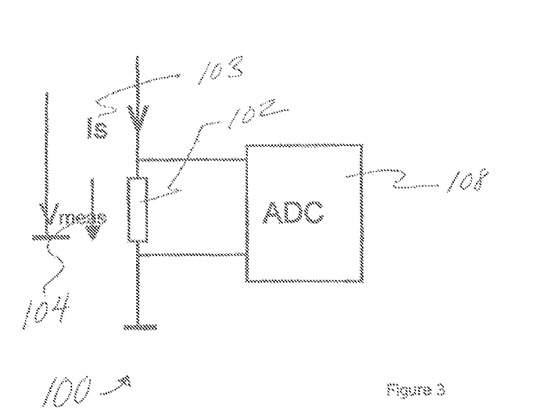
FIG. 3 shows an exemplary schematic diagram of an input stage of a shunt measurement unit in accordance with one embodiment of the invention.

FIG. 3 shows an exemplary schematic diagram of an input stage of a shunt measurement unit in accordance with one embodiment of the invention. An input stage for a shunt measurement unit in accordance with embodiments of the invention 100 comprises a shunt to be measured, 102, with a shunt current (Is) 103, and a shunt voltage (Vmeas) 104, and an Analog-to-Digital Converter (ADC) 108 preferably located on an integrated circuit. The ADC is directly coupled to the shunt 102 without the presence of a preamplifier. The ADC 108 utilizes a full scale input voltage in the range of Vmeas 104, and any resulting common mode voltage could be handled using a switched capacitor ADC. In another embodiment, a filter may be integrated into the ADC. The absence of an anti-aliasing filter in the embodiment in FIG. 3 means that the filter cannot be overdriven thereby eliminating a long recovery time. Thus, because the shunt circuit and the ADC are integrated on an integrated circuit, embodiments of the invention advantageously reduce the overall area required for the shunt circuit while increasing the circuit's accuracy (e.g., less points where noise can be introduced and signals can be distorted).

Figure 4:
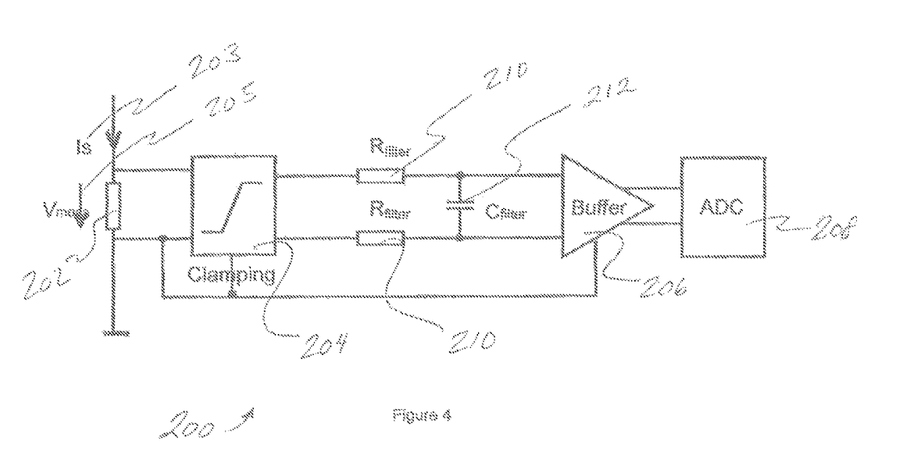
FIG. 4 shows an exemplary schematic diagram of an input stage of a shunt measurement unit in accordance with another embodiment of the invention.

FIG. 4 shows an exemplary schematic diagram of an input stage of a shunt measurement unit in accordance with another embodiment of the invention. An input stage 200 in accordance with another embodiment of the invention comprises a shunt to be measured, 202, a shunt current (Is) 203, a clamping circuit 204, a shunt voltage (Vmeas) 205, a buffer 206, an ADC 208, a passive RC filter 210, 212 for anti-aliasing, preferably located on an integrated circuit. The ADC 208 may be on a different power domain than the input structure to be measured 202, and the common mode voltage difference may be handled by using a switched capacitor ADC. The buffer 206 enables the integration of the filter 210, 212, and is helpful for steering the ADC 208.

In another embodiment, the buffer 206 may be removed as long as a non-complete settling at the ADC input is tolerated. The passive clamping circuit 204 enables clamping of the signal delivered to the anti-aliasing filter 210, 212. In yet another embodiment, an active input buffer may be used instead of the clamping circuit 204. The clamping circuit 204 and the buffer 206 may be coupled to the negative node of the shunt 202. A small current in the shunt node 202 should pose no problem for the system 200, but the coupling of the integrated shunt circuit 200 to the shunt 202 will create some resistance causing an offset. This offset may be cancelled by calibration.

Figure 5:
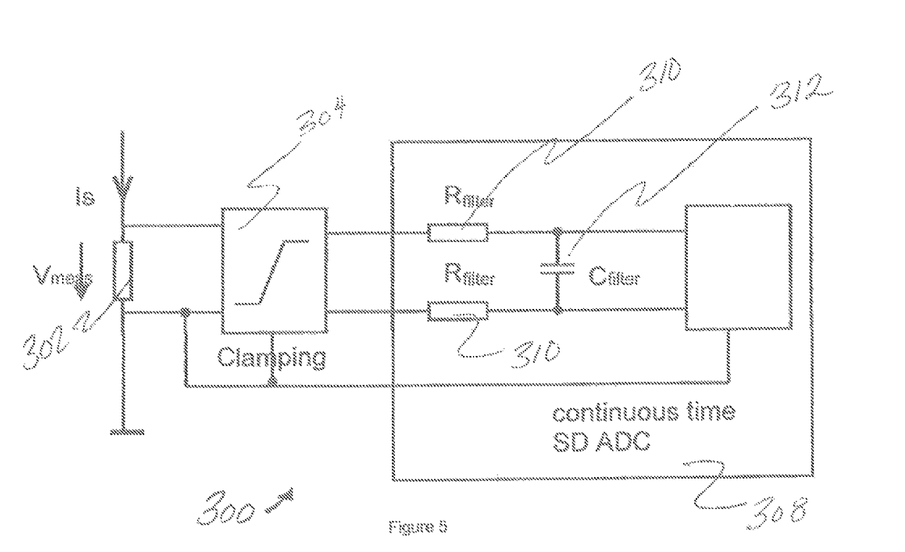
FIG. 5 shows an exemplary schematic diagram of an input stage of a shunt measurement unit in accordance with another embodiment of the invention.

FIG. 5 shows an exemplary schematic diagram of an input stage of a shunt measurement unit 300 in accordance with another embodiment of the invention. The input stage 300 comprises a shunt to be measured 302, a clamping circuit 304 and a continuous time sigma Delta ADC (CT SD ADC) 308. This CT SD ADC 308 provides a filter function at the input stage and does not require a buffer. The common mode shift of the ADC to the following digital parts of the control device can be handled with level shifters. The common mode voltage between the shunt voltage domain and a digital domain of the control device may be very high (for example, up to 10V or higher if the shunt is battery located). The signal must be transferred between these voltage domains via analog or digital means (e.g., via capacitive level shifters).

In FIG. 5, the output signal of the ADC is digital and may then be applied to a level shifter and used in the other voltage domain. In another embodiment, transformers may be used to transfer the ADC output signal based on coils providing a galvanic isolation between the ADC and another part of the control device.

Figure 6:
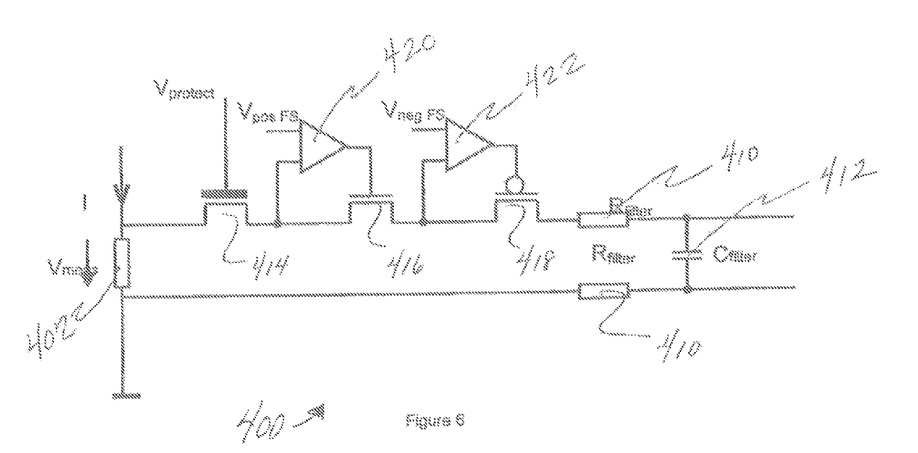
FIG. 6 shows an exemplary schematic diagram of a clamping circuit for the anti-aliasing filter in accordance with one embodiment of the invention.

In an embodiment, the input stage comprises an ADC with a simple circuit for the clamping circuit and the buffer. Referring now to FIG. 6, there is shown an exemplary schematic diagram of a clamping circuit for the anti-aliasing filter in accordance with one embodiment of the invention. A high voltage protection device 414 precedes the signal path. The device operates as a cascode whereby the gate 414 is coupled to a defined Vprotect signal path. The voltage is passed to the filter via a fast PMOS 416 and NMOS 418 cascode to the filter. Both devices operate as regular cascodes whereby the levels of the reference voltages Vpos and Vneg define the maximum voltage passed to the filter. The voltage Vpos delivered to the NMOS device defines the maximum positive voltage (Full Scale Voltage=FS), and the voltage Vneg delivered to the PMOS device defines the maximum negative voltage. This type of circuitry can be implemented much more easily than the preamplifier. For the buffer circuit, a simple source follower can be used to decouple the ADC from the filter. It is of benefit to use a PMOS source follower because the input voltage is ground related.

Figure 7:
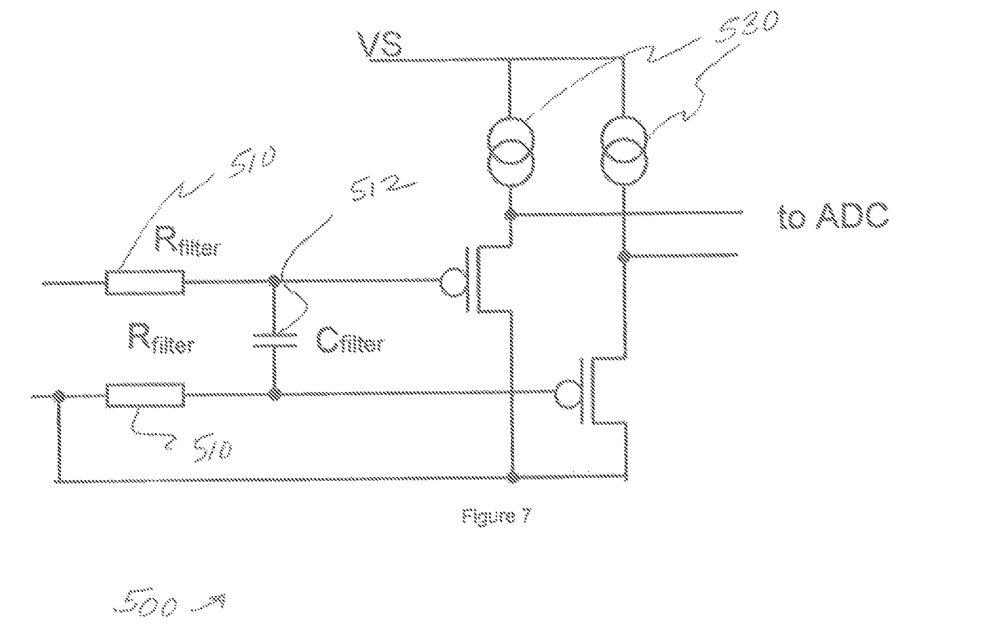
FIG. 7 shows an exemplary schematic diagram of a buffer for the ADC in accordance with one embodiment of the invention.

FIG. 7 shows an exemplary schematic diagram of a buffer for the ADC in accordance with one embodiment of the invention. The buffer 500 comprises source followers 530. In one embodiment, the signal may be passed in the analog domain, and the output of the buffer drives the capacitors coupled to the ADC. Because a switched capacitor load cannot be coupled directly to a high impedance output, the load of the switch capacitor requires a low driving circuit or requires incomplete settling. To implement complete settling, the buffer 500 may be used. The source followers 530 provide the current to the switched capacitors of the ADC. Thus, the buffer is more efficient and robust than a preamplifier. In another embodiment, the buffer may also be implemented using two or more stage architectures.

Depending on the operating mode of the source device or on the change (from an old operating mode to a new operating mode), parameters of the input stage can be adapted, such as the clamping levels (e.g., via modification of the reference voltages Vpos or Vneg) or the input filter characteristics (e.g., the order of the filter or the filter time constant, e.g., as defined by Rfilter and Cfilter).

In one embodiment, the reference voltages can be adapted by a DAC mechanism (digital to analog converter) that is controlled according to the operating mode of the source device. The values of Rfilter or Cfilter may also be adapted by switching more or less R elements or C elements in parallel.

Figure 8:
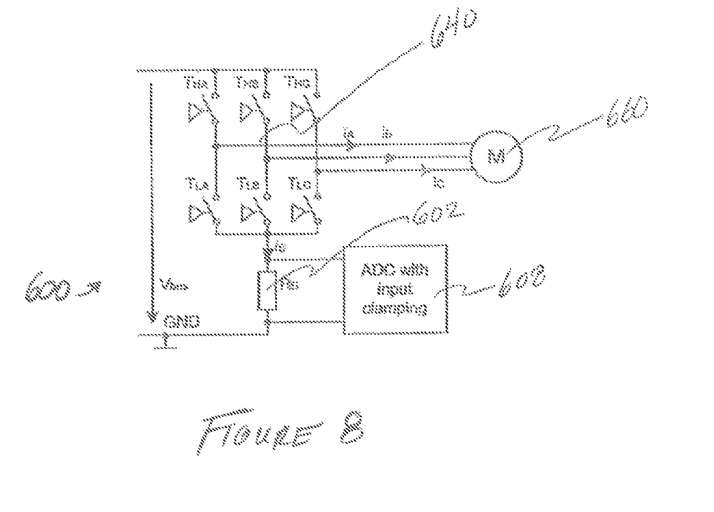
FIG. 8 shows an exemplary schematic diagram of a shunt circuit where a 3-phase motor is controlled by a B6 bridge and the phase currents are measured via a common shunt.

FIG. 8 shows a schematic diagram of a shunt circuit where a 3-phase motor 660 is controlled by a B6 bridge 640 and the phase currents (Ia, Ib, Ic) are measured via a common shunt. The shunt circuit 600 comprises a shunt to be measured 602, a ADC with input clamping 308, and a B6 bridge 640. The B6 bridge 640 further comprises 3 independent half bridges each with a low-side transistor TLx and a high side transistor THx, one half bridge for each phase current. The current, Is, through the common shunt 602 changes significantly as a function of the status of the switches in the bridges. Thus, control patterns for the switches can be generated by means of a PWM timer. The PWM patterns applied to the switches TLx and THx of the bridges control which of the phases of the motor is connected to the positive supply Vbus or to the negative supply GND of the B6 bridge. The PWM patterns change quickly (typical PWM frequencies are in a range of 20 kHz or more) to achieve smooth phase currents. Typically, during one period of the PWM, up to 3-4 different PWM patterns are applied to the switches. As a result, the resulting shunt voltage to be measured by the ADC can change very quickly, since a PWM pattern can be applied to the B6 bridge only during a very short time interval (typically a few microseconds).

The current through the common shunt can be used to determine the phase currents if the shunt voltage measurement takes place exactly when the related PWM pattern is applied to the bridge. The phase currents can only be exactly measured if the ADC measurements are synchronized to the PWM patterns for the switches.

Thus, the following PWM patterns can be applied:
TLA, TLB, TLC closed: no current measurement (free-wheeling)
TLA, TLB, THC closed: Is=Ic
TLA, THB, TLC closed: Is=Ib
TLA, THB, THC closed: Is=−Ia
THA, TLB, TLC closed: Is=Ia
THA, TLB, THC closed: Is=−Ib
THA, THB, TLC closed: Is=−Ic
THA, THB, THC close: no current measurement (free-wheeling)

While a pattern leading to free-wheeling is applied to the bridge, no additional energy is transferred to the motor, whereas during the other PWM patterns, additional energy can be delivered to the motor.

In one embodiment, the switching pattern needed to determine a phase current is only applied for a very short time. This happens regularly depending on the rotor position or especially in the case of a low load at the motor, when patterns leading to the free-wheeling of the bridge are applied during a long interval of each PWM period.

Each PWM pattern can be interpreted as an independent operating mode of the shunt device because the value and the meaning of the shunt voltage may change from one PWM pattern applied to the bridge to the next PWM pattern.

Depending on the load condition of the motor and the load applied to the motor, the same PWM pattern can lead to different shunt voltages. For example, in the case of a high load on the motor, the phase current amplitudes are much higher compared to the amplitudes for the same PWM pattern with a low load on the motor.

Thus, the threshold for an adjustable clamping circuit or slope limitation circuit at the input of the ADC should be set depending on the PWM applied pattern and the load condition on the motor.

The reaction time of the ADC or a comparator device (not shown) is defined by the settling time of the input structure. The higher the allowed overshoot of the voltage due to a change in the operating mode, the longer the settling time can be before the desired accuracy of the signal is reached.

In state-of-the-art circuits, a maximum value is taken that can occur during operation of the motor under all load conditions. This maximum value (e.g., used as a threshold value for the clamping element) would limit input signal overshoot due to commutation of the load current from one PWM pattern to the other. If the same maximum value is always applied, this may lead to a settling time longer than needed for smaller current values. For low load conditions, commutation noise and gate driver currents are more important than settled load current values. Although only a short time interval for measurement is available, a long settling time would be required if a fixed high threshold is applied.

Thus, an adjustable threshold for the clamping circuit in accordance with embodiments of the invention minimizes the overshoot and, as a consequence, also the settling time. This allows the system to be used for smaller load currents, and ADC measurement can happen more quickly after a change in the operating mode of the shunt device.

Figure 9:
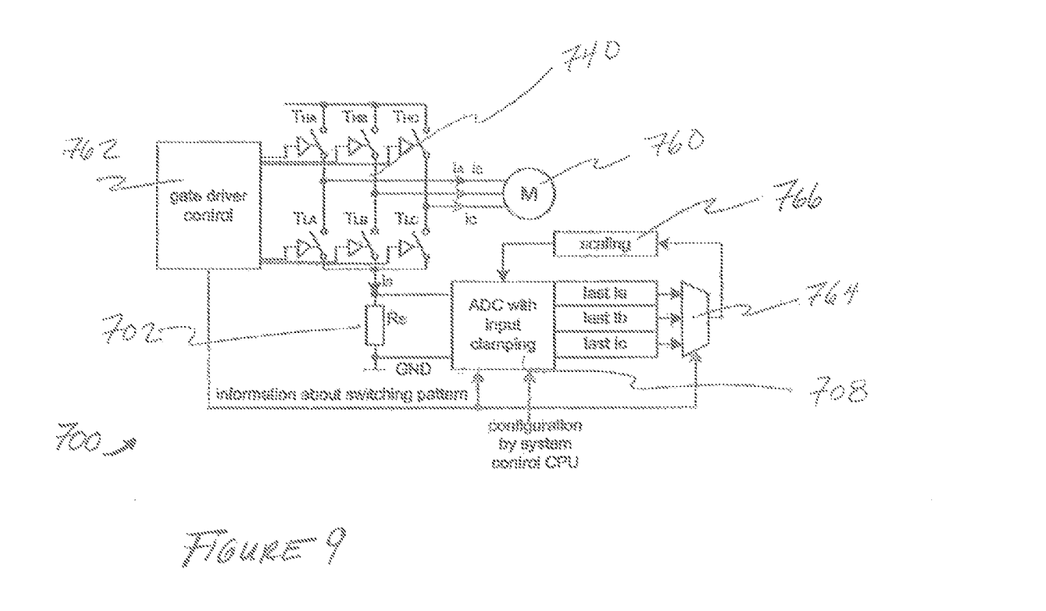
FIG. 9 shows an exemplary schematic diagram of an input stage of a shunt measurement unit with an adjustable clamping circuit in accordance with one embodiment of the invention.

FIG. 9 shows an exemplary schematic diagram of an input stage of a shunt measurement unit 700 with an adjustable clamping circuit in accordance with one embodiment of the invention. The shunt circuit 700 comprises a shunt to be measured 702, an ADC with an adjustable clamping circuit 708, a 3-phase motor 760 controlled by a B6 bridge 740, a gate driver control 762, a system controller 764, and a scaling unit 766.

In one embodiment, the adjustable clamping circuit 700 or slope limitation threshold can be controlled depending on the load current of the expected measurement current for the next control pattern.

In another embodiment, the system controller 764 configures the threshold value depending on the load current. For higher load currents, a higher threshold can be applied, whereas for lower currents, a lower threshold can be set. Thus, embodiments of the invention advantageously reduce the settling time for the ADC input state for lower phase currents.

In yet another embodiment, the switching pattern itself delivers the information about the threshold to be applied. The motor position and as a consequence, the phase currents change much more slowly than a PWM period, a threshold value based on the actually measured phase current during the similar switching pattern of the last PWM period(s) can be automatically applied. As a result, the threshold and the settling time after the commutation follow the shape of the phase currents. Variations due to load changes and reference values for the control loop may be respected also when elaborating the thresholds. For example, a threshold can be set to 150% of the latest measured current with the same switching pattern (effected by scaling unit 766). Thus, if the ADC with the adjustable clamping or slope limitation stage has the information about the switching patterns (e.g., they are integrated in the same device), measurement results can be stored depending on the switching patterns. This embodiment also eases the CPU treatment of the measured phase currents because the results are already sorted in an appropriate way (e.g., the CPU can read phase current Ia in a register corresponding to the previous Ia).

In another embodiment, the length of the adjustable clamping or slope limitation interval may be configured after a change in the switching patterns to allow a faster reaction to short circuit conditions. In such cases, the threshold should not be applied during the duration of a switching pattern, but only after a change in the switching pattern. Additionally, the ADC intrinsic filter mechanism (e.g., if a SigmaDelta data stream is generated) can be reset after a change in the switching pattern. This reduces the time until a new valid conversion result is available.

In yet another embodiment, a control unit controlling the operating mode of the source device (e.g., a PWM unit) can be implemented on the same device as the input stage of the measurement unit and can directly influence it. In another embodiment, this unit can be connected via control lines to the input stage. In both cases, the control unit can indicate a change in the operating mode of the source device before the change becomes effective. This control signal, provided in advance, can lead to a change in the parameters of the input structure ahead-of-time to minimize the reaction time. Especially for very short measurement windows, this method could be used.

In another embodiment, the control unit can indicate time windows just before or just after a change in the operating mode of the source device to blank reactions of the input stage or to force internal values to defined levels. This ensures a defined starting behavior of the input stage in the case of a change in operating mode.

Figure 10:
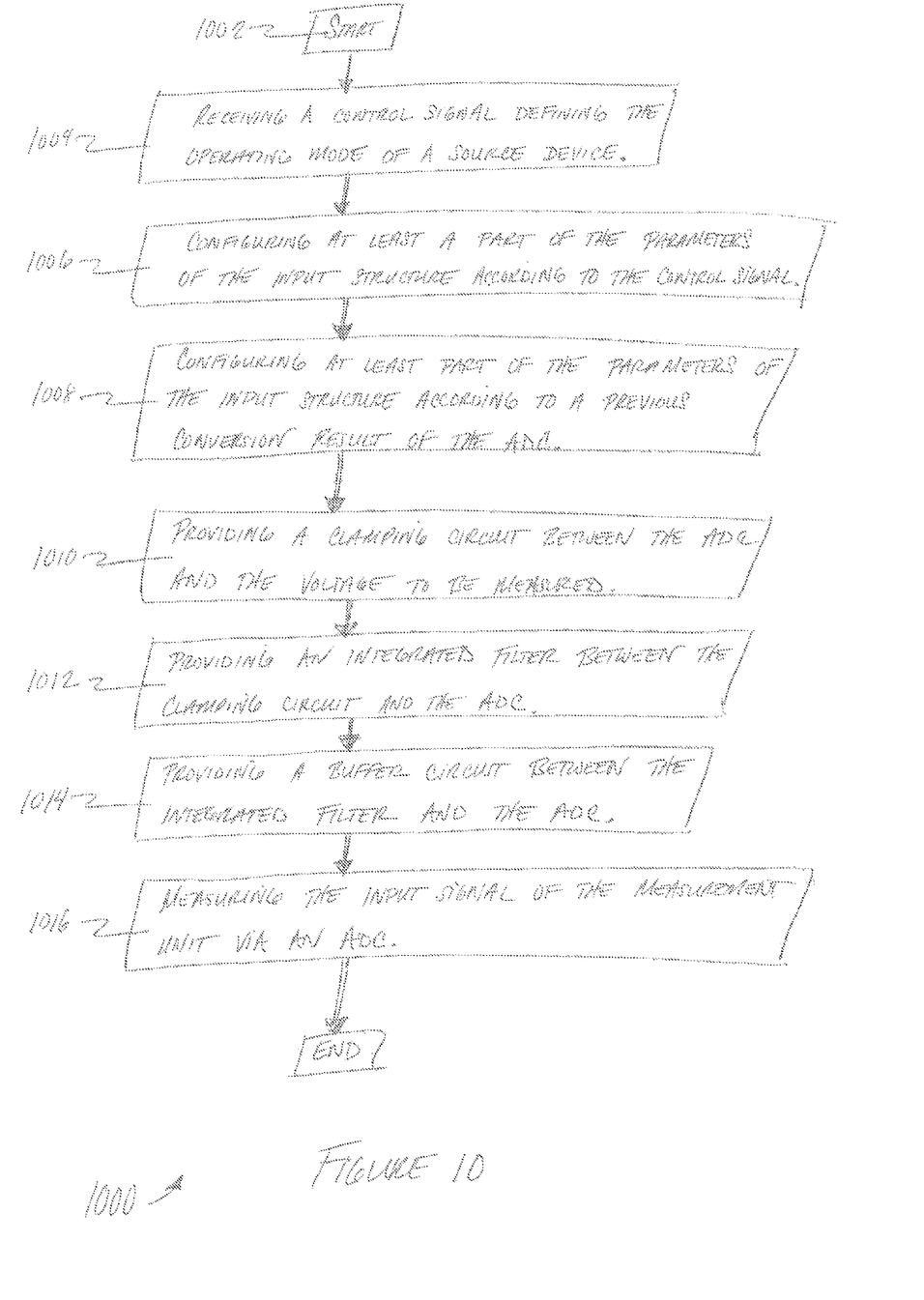
FIG. 10 is a flowchart showing a method for performing a shunt measurement in accordance with another embodiment of the invention.

FIG. 10 is a flowchart showing a method 1000 for performing a shunt measurement in accordance with one embodiment of the invention. For clarity, the method 1000 for performing a shunt measurement is described in context of the systems described in the previous figures. However, in alternate embodiments, other configurations may be used. Moreover, other embodiments may perform the steps described here in different orders and/or other embodiments may perform additional and/or different steps than those described here.

A method 1000 for configuring parameters of an input structure of a shunt measurement unit comprises the steps of receiving 1004 a control signal defining the operating mode of a source device and configuring 1006 at least a part of the parameters of the input structure according to the control signal. In one embodiment, the method further comprises the step of configuring 1008 at least a part of the parameters of the input stage according to a previous conversion result of the analog-to-digital converter. In another embodiment, the method may further comprise the steps of providing 1010 a clamping circuit coupled between the ADC and the voltage to be measured, providing 1012 an integrated filter coupled between the clamping circuit and the ADC, and providing 1014 a buffer circuit coupled between the integrated filter and the ADC. Finally, embodiments of the invention comprise the step of measuring 1016 the input signal of the measurement unit via the ADC.

Although specific embodiments have been illustrated and described herein, it will be appreciated by those of ordinary skill in the art that a variety of alternate and/or equivalent implementations may be substituted for the specific embodiments shown and described without departing from the scope of the embodiments of the invention. This application is intended to cover any adaptations or variations of the specific embodiments discussed herein.

What is claimed is:

1. A measurement unit comprising:
an input for a source device, the source device configured to provide a first analog voltage level to be measured in a first operating mode of the source device and a second analog voltage level to be measured in a second operating mode of the source device;
a control input configured to detect an operating mode of the source device; and
an input stage configured to minimize a reaction time of the measurement unit after a change of the operating mode of the source device, wherein the input stage comprises a shunt resistor.

2. The measurement unit according to claim 1, further comprising means to change at least one parameter of the input stage according to the operating mode of the source device.

3. The measurement unit according to claim 2, wherein the input stage contains a clamping structure for its input voltage that can be configured according to the operating mode of the source device.

4. The measurement unit according to claim 3, wherein the clamping structure further comprises a high voltage protection device and a PMOS and NMOS cascode.

5. The measurement unit according to claim 2, wherein the input stage contains a filter structure for its input voltage that can be configured according to the operating mode of the source device.

6. The measurement unit according to claim 2, wherein the at least one parameter of the input stage is configured for different operating modes of the source device.

7. The measurement unit according to claim 6, wherein the at least one parameter is configured to be changed dynamically.

8. The measurement unit according to claim 1, wherein the control input is configured to be connected to at least one control signal for a power switch, and wherein a logic state of a power switch control signal defines at least one parameter of the input stage.

9. The measurement unit according to claim 1, wherein the input stage comprises an analog-to digital converter (ADC), and wherein the ADC is configured to convert at least one analog voltage level delivered by the source device.

10. The measurement unit according to claim 9, further comprising means to change the parameters of the input stage at least partly based on a previous conversion result of the ADC.

11. The measurement unit according to claim 1, wherein the input stage further comprises a buffer.

12. A method of configuring parameters of an input structure of a measurement unit, the method comprising:
receiving a control signal defining an operating mode of a source device; and
configuring at least one parameter of the input structure according to the control signal, wherein the input structure comprises a shunt resistor.

13. The method according to claim 12, further comprising measuring an input signal of the measurement unit via an analog-to-digital converter.

14. The method according to claim 13, further comprising configuring the at least one parameter of the input structure according to a previous conversion result of the analog-to-digital converter.

15. The method according to claim 12, further comprising providing an integrated filter coupled between an ADC and a voltage to be measured.

16. The method according to claim 12, further comprising providing a clamping structure coupled between an integrated filter and a voltage to be measured.

17. The measurement unit according to claim 1, wherein the operating mode depends on a load condition of an electric motor.

18. The measurement unit according to claim 1, wherein the ADC is connected to the shunt resistor without a presence of a preamplifier.

19. The method according to claim 12, wherein the operating mode depends on a load condition of an electric motor.

* * * * *